United States Patent
Kim (10) Patent No.: US 6,923,704 B2
(45) Date of Patent: Aug. 2, 2005

(54) FLAT PANEL DISPLAY DEVICE AND FABRICATION METHOD THEREOF

(75) Inventor: Chang Nam Kim, Seoul (KR)

(73) Assignee: LG Electronics Inc., Seoul (KR)

(*) Notice: Subject to any disclaimer, the term of this patent is extended or adjusted under 35 U.S.C. 154(b) by 154 days.

(21) Appl. No.: 10/645,544

(22) Filed: Aug. 22, 2003

(65) Prior Publication Data

US 2004/0038617 A1 Feb. 26, 2004

Related U.S. Application Data

(62) Division of application No. 09/969,612, filed on Oct. 4, 2001, now Pat. No. 6,611,095.

(30) Foreign Application Priority Data

Oct. 6, 2000 (KR) .......................................... 2000-58914

(51) Int. Cl.[7] .............................................. H05B 33/10
(52) U.S. Cl. .......................................... 445/24; 445/25
(58) Field of Search ...................... 445/24, 25; 313/500, 313/505; 315/169.3

(56) References Cited

U.S. PATENT DOCUMENTS

| | | | |
|---|---|---|---|
| 4,855,641 A | | 8/1989 | Nakamura et al. |
| 4,935,665 A | | 6/1990 | Murata |
| 4,999,539 A | * | 3/1991 | Coovert et al. ............. 313/505 |
| 5,736,754 A | * | 4/1998 | Shi et al. .................... 313/509 |
| 5,836,797 A | | 11/1998 | Suzuki et al. |
| 5,873,760 A | * | 2/1999 | Wei et al. ..................... 445/24 |
| 5,902,688 A | * | 5/1999 | Antoniadis et al. ......... 313/505 |
| 5,911,614 A | * | 6/1999 | Nishimura et al. .......... 445/25 |
| 5,925,472 A | | 7/1999 | Hu et al. |
| 5,936,344 A | | 8/1999 | Nagayama |
| 6,140,765 A | | 10/2000 | Kim et al. |
| 6,259,200 B1 | | 7/2001 | Morita et al. |
| 6,348,359 B1 | | 2/2002 | Van Slyke et al. |

* cited by examiner

Primary Examiner—Mariceli Santiago
(74) Attorney, Agent, or Firm—Fleshner & Kim, LLP.

(57) ABSTRACT

A flat panel display device and fabrication method thereof are provided. The device includes a lower electrode area formed on a substrate and defining luminescent pixels, at least one auxiliary pattern formed on at least one edge area of the substrate so as to be separated from the lower electrode area, and an insulating layer formed on an area excluding the luminescent pixels so as to at least partially overlap with the at least one auxiliary pattern, thereby improving device performance and endurance by forming an insulating layer having a desirable shape.

4 Claims, 7 Drawing Sheets

FLAT PANEL DISPLAY DEVICE AND FABRICATION METHOD THEREOF

This application is a divisional of application Ser. No. 09/969,612, filed Oct. 4,2001, now U.S. Pat. No. 6,611,095, issued Aug. 26,2003.

BACKGROUND OF THE INVENTION

1. Field of the Invention

The present invention relates to a flat panel display device and fabrication method thereof.

2. Background of the Related Art

An insulating layer is essential for fabricating a flat panel device.

In flat panel displays, an organic EL (electroluminescent) device emits a light in a manner that electric charges are injected into an organic layer between an electron injection electrode (cathode) and a hole injection electrode (anode), electrons and holes are paired, and the resulting pairs emit light. The EL device is driven by a low voltage and consumes less power.

In this case, an insulating layer is formed on a substrate so as to cover the edges of the anode which are vulnerable during the fabrication process.

When the edges of the anode are damaged, the cathode and anode are easily shorted. Once the cathode and anode are shorted, the organic layer between the cathode and anode is damaged. Thus, the ELD device fails to emit light normally.

Insulating layers are mainly divided into inorganic insulating layers and organic insulating layers. The inorganic insulating layers include oxide, nitride and the like, while the organic insulating layers include polyimide, polyacryl, photoresist and the like.

However, the use of inorganic insulating layers requires highly expensive equipment. Therefore, organic insulating layers have greater merit using a conventional PR (photoresist) line for fabrication.

An organic insulating layer in a display device is formed on glass or ITO (indium tin oxide). Namely, patterns of the organic insulating layer are defined on the glass including the patterned ITO. The ITO includes auxiliary electrodes such as a bus electrode and the like.

Figure 1:
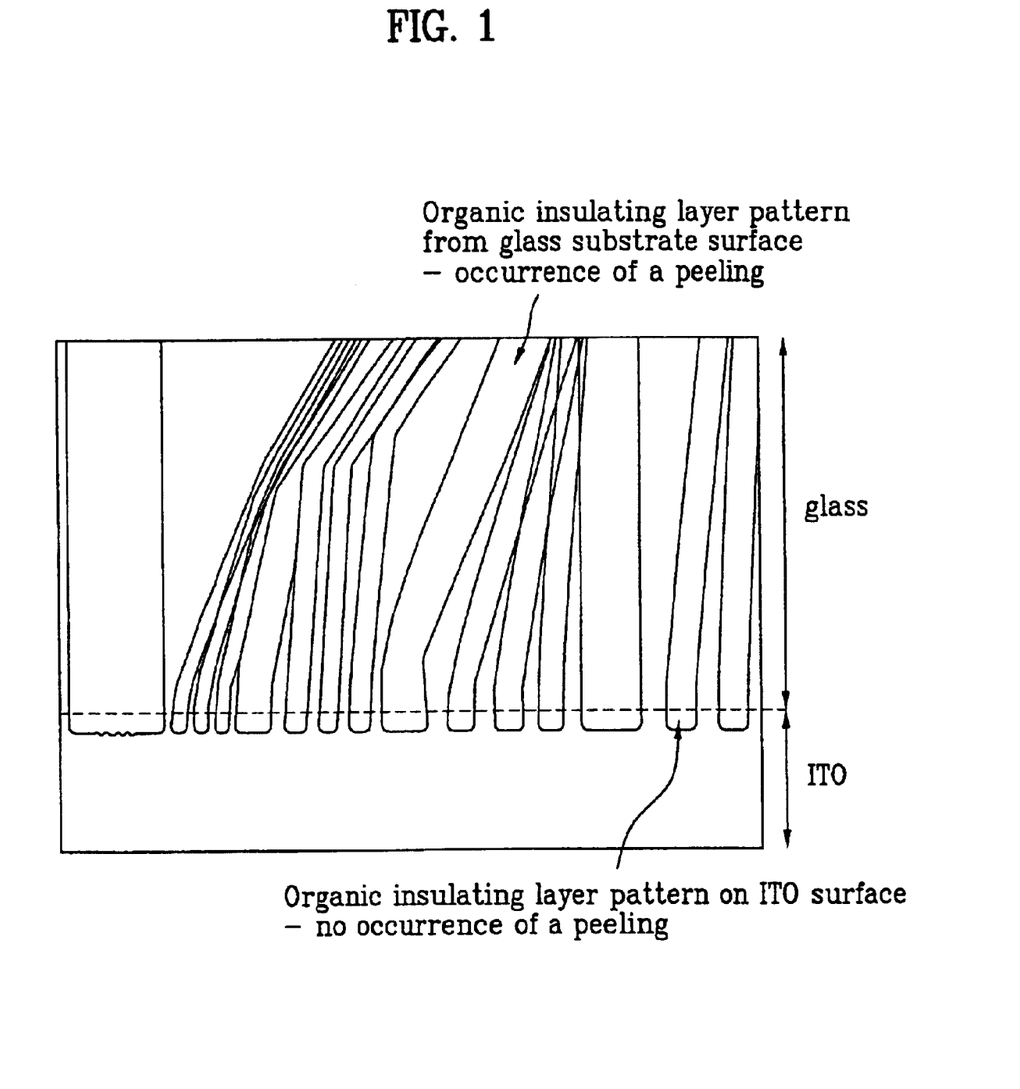
FIG. 1 and FIG. 2 illustrate diagrams for explaining the peeling during a process of forming organic insulating layer patterns according to a related art.
Figure 2:
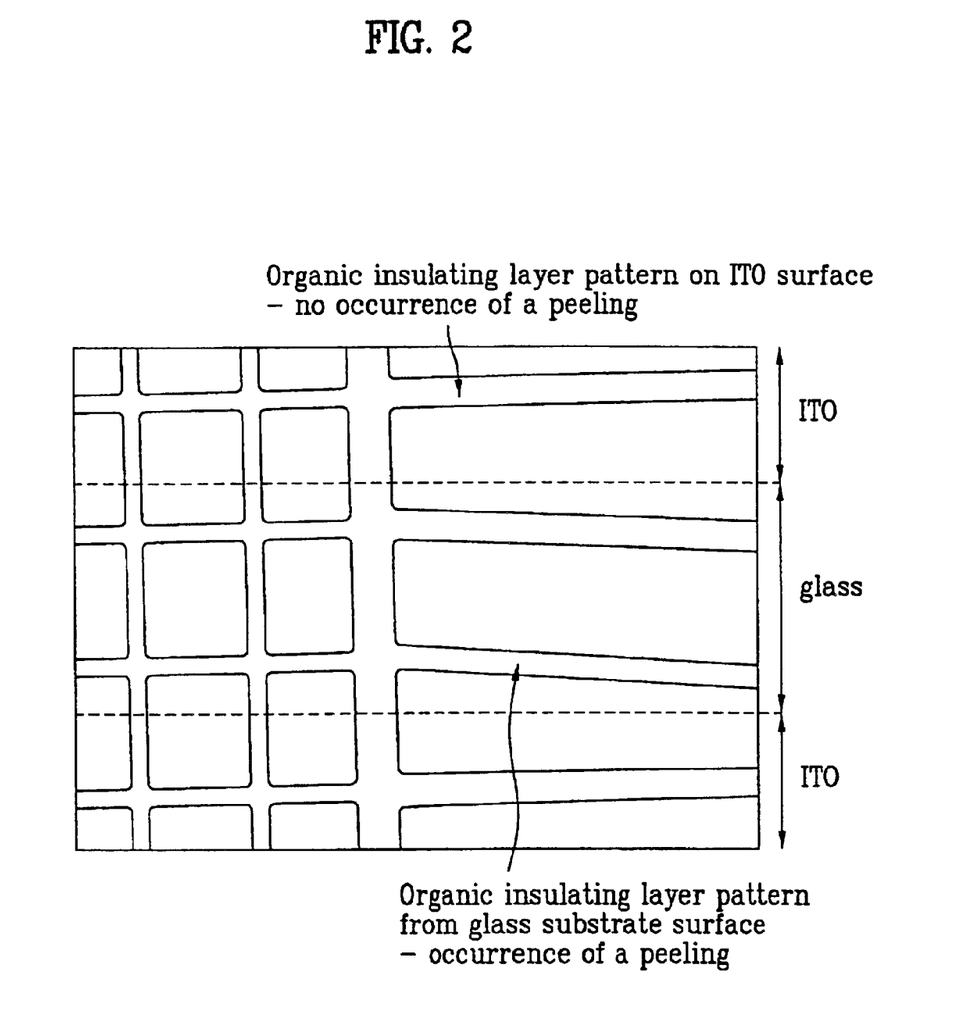

Such a process, as shown in FIG. 1 and FIG. 2, of defining an organic insulating pattern results in disadvantages. Most organic insulating layers have excellent adhesion to ITO but poor adhesion to glass. When organic insulating layer patterns are developed, the patterns at the ITO side remain intact but those at the glass side peel off As mentioned in the above explanation, a flat panel device according to the related art brings about problems/disadvantages such as residues of an organic insulating layer during a patterning process, poor shapes of inorganic insulating layer patterns, and the like, thereby degrading characteristics such as device performance, endurance and the like.

SUMMARY OF THE INVENTION

Accordingly, the present invention is directed to a flat panel display device and fabrication method thereof that substantially obviates one or more problems due to limitations and disadvantages of the related art.

An object of the present invention is to provide a flat panel display device and fabrication method thereof which eliminates the peeling of an insulating layer.

The present invention, which is characterized in that at least one auxiliary pattern, as well as lower electrodes, is formed on an edge of a substrate of a flat panel display so as to overlap with an insulating layer, preventing peeling of the insulating layer from the substrate.

Moreover, the adhesion between the auxiliary pattern and insulating layer is superior to that between the substrate and insulating layer, whereby the present invention enables the peeling of an insulating layer from a substrate to be greatly reduced.

Additional advantages, objects, and features of the invention will be set forth in part in the description which follows and will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flat panel display device according to the present invention includes a lower electrode area formed on a substrate and defining luminescent pixels, at least one auxiliary pattern formed on at least one edge area of the substrate so as to be separated from the lower electrode area, and an insulating layer formed on an area excluding the luminescent pixels so as to be overlapped in part with at least one auxiliary pattern.

In another aspect of the present invention, a flat panel display device includes a plurality of lower electrodes extending on a substrate in one direction, a plurality of luminescent pixels formed on and defined by the lower electrodes, a plurality of connection tabs formed on one edge of the substrate in a direction crossing with the extending direction of the lower electrodes so as not to overlap the lower electrodes, an insulating layer formed on an area excluding the luminescent pixels and the lower electrodes, at least one auxiliary pattern formed at an edge area of the substrate so as to overlap at least in part with the insulating layer to prevent the insulating layer from peeling, and an upper electrode formed over the lower electrodes so as to make contact with the connection tabs.

Preferably, the device further includes at least a second auxiliary pattern between the lower electrodes and connection tabs, respectively, so as to at least partially overlap with the insulating layer. In this case, the distance is similar to that between the adjacent pixels in the direction crossing with the extending direction of the lower electrodes, thereby preventing a leakage current.

In a further aspect of the present invention, a method of fabricating a flat panel display device includes the steps of forming a plurality of lower electrodes on a substrate so as to extend in one direction wherein luminescent pixels are defined over the lower electrodes, forming a plurality of connection tabs on one edge of the substrate in a direction crossing with the extending direction of the lower electrodes so as to not overlap the lower electrodes, and forming at least one auxiliary pattern on an edge area of the substrate, forming an insulating layer on an area excluding the luminescent pixels and the lower electrodes, so as to at least partially overlap at least one auxiliary pattern, and forming an upper electrode over the lower electrodes so as to make contact with the connection tabs.

As mentioned in the above explanation, the present invention, which is characterized in that at least one auxiliary pattern as well as lower electrodes are formed on a substrate, prevents the peeling of the insulating layer from the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF PREFERRED EMBODIMENTS

Reference will now be made in detail to the preferred embodiments of the present invention, examples of which are illustrated in the accompanying drawings.

A process of fabricating a flat panel display according to a first embodiment of the present invention is explained as follows after the description of a layout of the present invention.

FIG. 3A to FIG. 3E illustrate layouts of fabricating a flat panel display according to a first embodiment of the present invention.

Figure 3A:
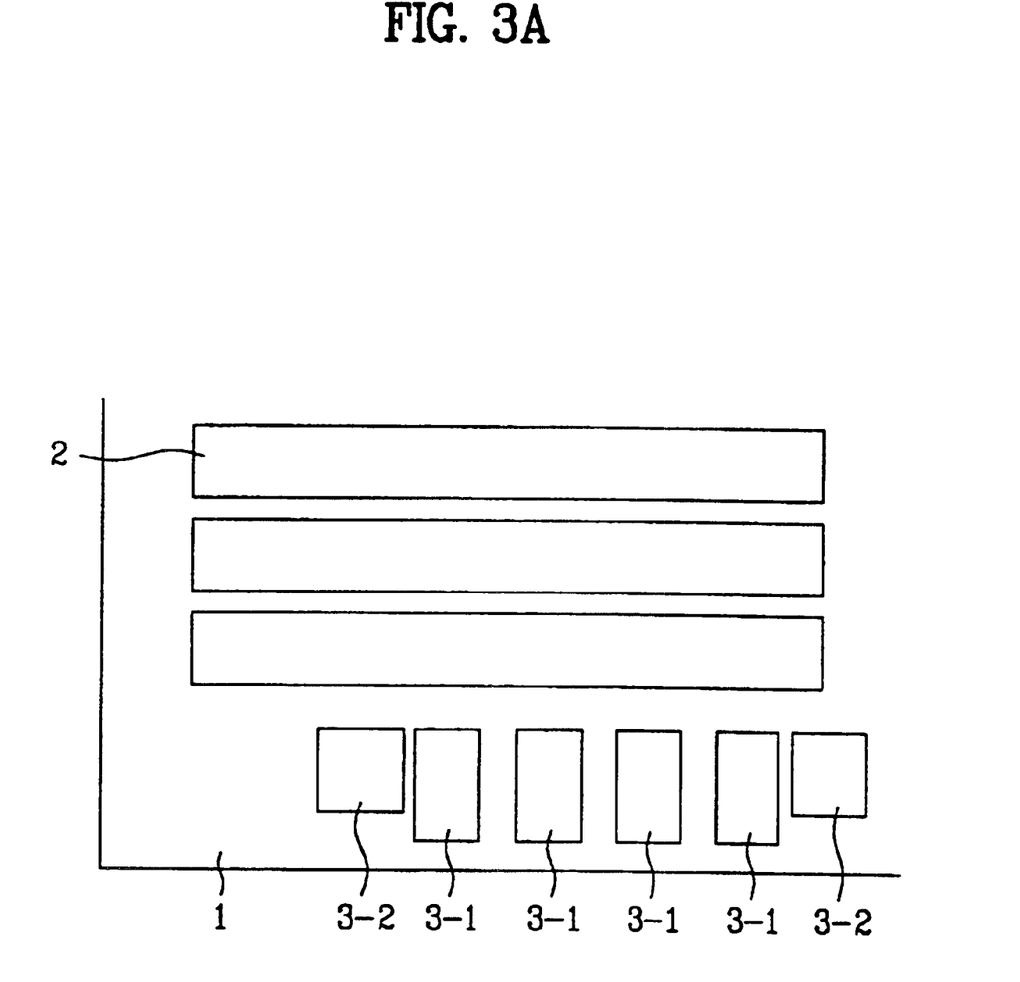
FIG. 3A to FIG. 3E illustrate layouts of fabricating a flat panel display according to a first embodiment of the present invention.
Figure 3B:
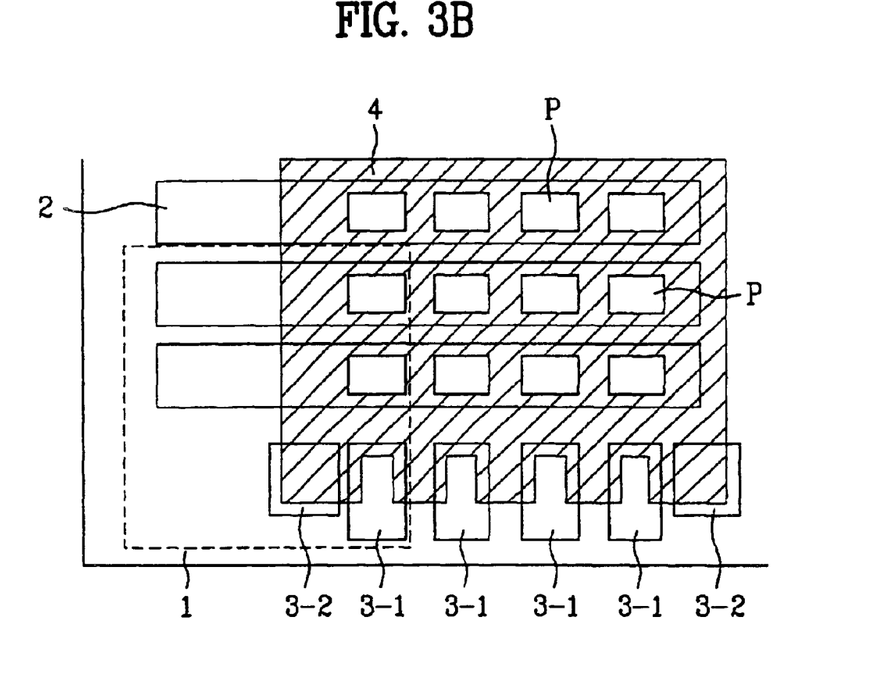
Figure 3C:
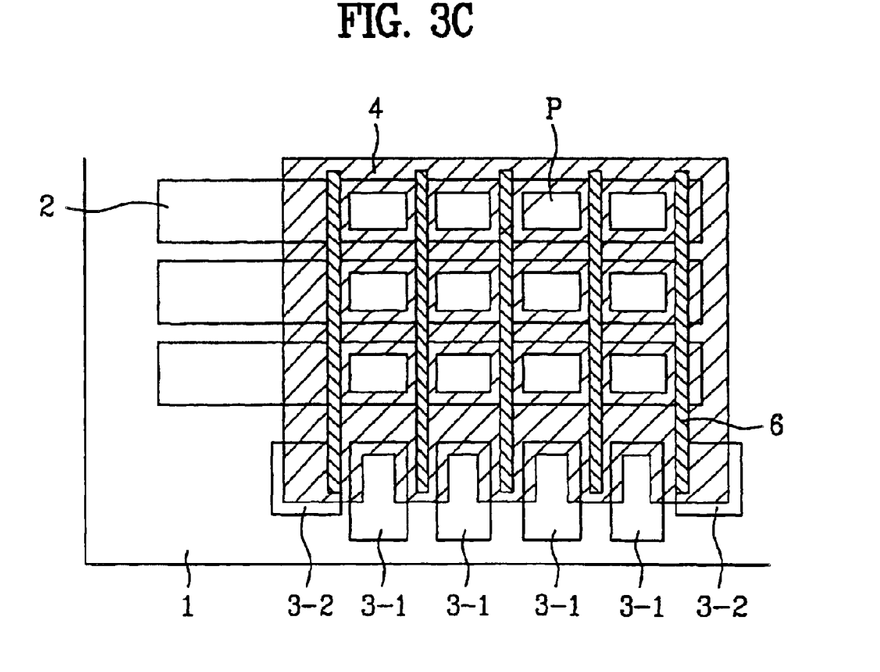
Figure 3D:
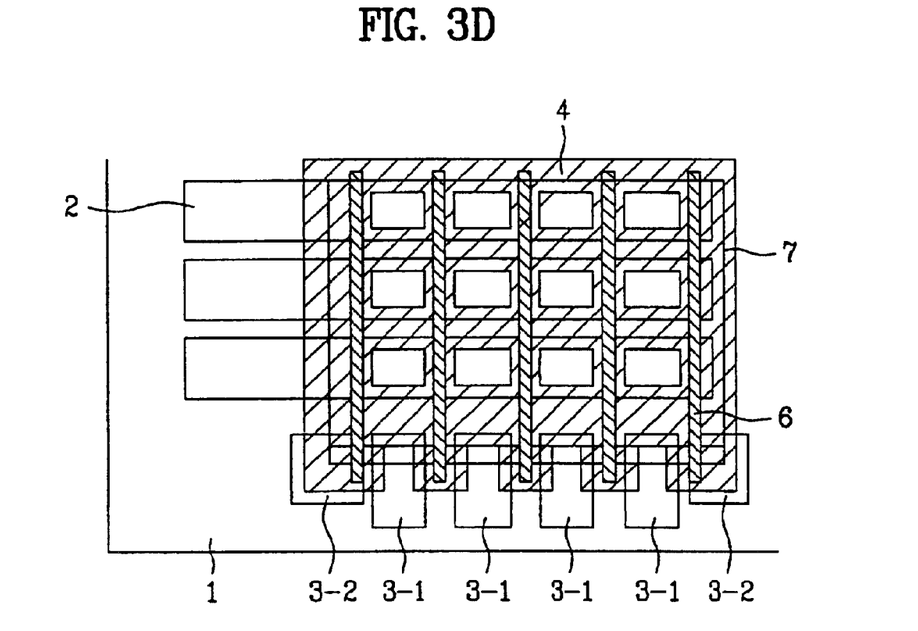
Figure 3E:
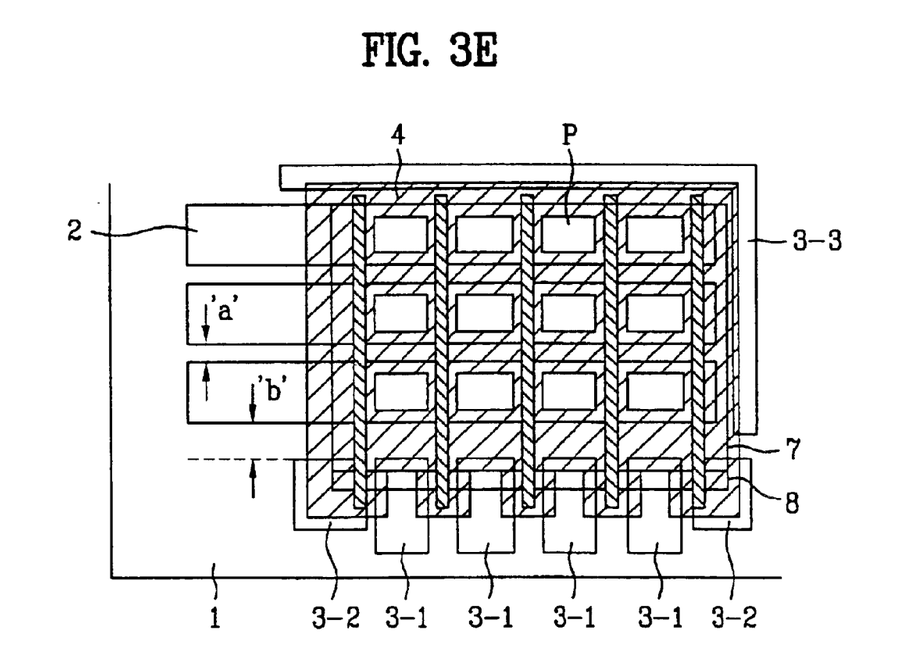

Referring to FIG. 3E, a flat panel display device according to a first embodiment of the present invention includes a plurality of lower electrodes 2 extending in one direction on a substrate 1, a plurality of luminescent pixels P formed and defined on the lower electrodes 2, a plurality of connection tabs 3-1 formed at one edge of the substrate 1 in a direction crossing with the extending direction of the lower electrodes 2 but not overlapping the lower electrodes 2, an insulating layer 4 on an area including the lower electrodes 2 but not the luminescent pixels P, at least one auxiliary pattern 3-2 formed at at least one corner of the substrate 1 so as to at least partially overlap the insulating layer 4 to prevent peeling of the insulating layer 4 formed on the substrate 1, and an upper electrode 8 formed over the lower electrodes 2 to make contact with the connection tabs 3-1.

If an organic EL device is fabricated, the flat panel display device according to the present invention further includes an organic luminescent layer 7 formed on the respective luminescent pixels P.

The flat panel display device according to the present invention further includes partition walls 6 formed between columns of the luminescent pixels P and in the direction crossing with the extending direction of the lower electrodes 2 so as to insulate the upper electrode 8.

The flat panel display device according to the present invention further includes an auxiliary electrode (not shown in the drawing) formed in a predetermined upper or lower area of the lower electrodes 2 and connection tabs 3-1, and having a resistance lower than those of the lower electrodes 2 and connection tabs 3-1.

The insulating layer 4 is formed on the substrate 1 so as to overlap with upper edges A of the connection tabs 3-1, thereby preventing the insulating layer 4 from peeling off of the substrate 1.

A partial area 'B' of the auxiliary patterns 3-2 is overlapped by the insulating layer 4, and maintains a certain distance from the adjacent connection tabs 3-1, thereby preventing the insulating layer 4 from peeling off of the substrate 1.

In this case, a material for the auxiliary pattern 3-2 is selected so that adhesiveness between the auxiliary pattern 3-2 and insulating layer 4 is superior to that between the substrate 1 and insulating layer 4.

For instance, if the substrate 1, connection tab 3-1, and auxiliary pattern 3-2 are formed of glass, a transparent conductive material such as ITO and the like, and the same material of the connection tab 3-1, respectively, peeling of the insulating layer 4 is greatly reduced because adhesiveness between the transparent conductive material and insulating layer 4 is superior to that between the glass and insulating layer 4.

A portion of each of the auxiliary patterns 3-2 has an area overlapped by the insulating layer 4. And, at least one auxiliary pattern is formed at the outer sides of both of the circumferential connection tabs 3-1 in the extending direction of the lower electrodes 2.

When the insulating layer 4, as shown in FIG. 3E, is formed so as to expose portions of the lower electrodes 2 and connection tabs 3-1 in order to electrically connect the flat panel display device to a driving circuit, an additional auxiliary pattern 3-3 is formed on the substrate 1 so as to be overlapped in part by the insulating layer 4, at a side not to be connected to the driving circuit for driving the device.

Therefore, a corner of the insulating layer 4 formed at the side which is not connected to the driving circuit is not touched directly by the substrate 1, thereby preventing peeling of the insulating layer 4.

An interval a between adjacent lower electrodes 2 is formed narrower than another interval b between the lower electrodes 2 adjacent to the connection tabs 3-1, which is for preventing the lower electrodes 2 and adjacent connection tabs 3-1. This is to prevent the lower electrodes 2 and adjacent connection tabs 3-1 from being shorted.

It is enough to form the auxiliary patterns 3-2 and 3-3 with a material whose adhesiveness to the insulating layer 4 is superior to its adhesiveness to the substrate 1.

Transparent conductive materials such as ITO and the like have better adhesiveness to the insulating layer 4 than to the substrate 1.

A method for fabricating the above flat panel display device is explained by referring to FIG. 3A to FIG. 3E as follows. FIG. 3A to FIG. 3E illustrate layouts of fabricating a flat panel display according to a first embodiment of the present invention.

Referring to FIG. 3A, a plurality of lower electrodes 2, over which luminescent pixels P are defined, are formed on a substrate 1 by extending a transparent conductive material, such as ITO, in one direction.

A plurality of connection tabs 3-1 and at least one auxiliary pattern 3-2 are formed at one end and a corner of the substrate 1, respectively, in another direction crossing with the extending direction of the lower electrodes 2, but not overlapping the lower electrodes 2. In this case, the connection tabs 3-1, auxiliary pattern 3-2, and lower electrodes 2 are formed simultaneously by the same patterning process.

The connection tabs 3-1 and auxiliary patterns 3-2 are formed of a transparent material. In this case, ITO is used for this embodiment.

The auxiliary pattern or patterns 3-2 plays no role in the flat panel display device but only prevents an insulating layer from peeling.

An auxiliary electrode (not shown in the drawing) such as a bus electrode may be further formed thereon in order to reduce the resistance of the lower electrodes 2.

The auxiliary electrode may be formed of a metal, whose resistance is lower than that of ITO, such as Cr, Al, Cu, W, Au, Ni, Ag, or the like.

Referring to FIG. 3B, an insulating layer 4 is formed on an exposed surface including the lower electrodes 2, but excluding the area of the respective luminescent pixels P, so as to at least partially overlap with the auxiliary pattern 3-2. In this case, the insulating layer 4 is formed to overlap the upper edges of the connection tabs 3-1.

The auxiliary patterns 3-2 are formed of a transparent conductive material whose adhesiveness to the insulating layer 4 is superior to its adhesiveness to the substrate 1, thereby reducing the peeling of the insulating layer 4 from the substrate 1.

The insulating layer 4 is formed using an insulator, including either inorganic or organic materials. The inorganic materials include oxide, nitride and the like, as well as an inorganic matter dissolved in a solvent for spin-coating. The organic material is preferably a polymer of high molecular content, including photoresist, polyimide, polyolefin, and the like.

Referring to FIG. 3C, partition walls 6 are formed on the insulating layer 4 between columns of the luminescent pixels P, and in the direction crossing with the extending direction of the lower electrodes 2. Therefore, portions of an upper electrode, which will be formed by a following process, become isolated electrically from each other by the partition walls 6 between the columns of the luminescent pixels P.

Referring to FIG. 3D, an organic luminescent layer 7 is deposited on an area including the luminescent pixels P but smaller than the insulating layer 4.

Referring to FIG. 3E, an upper electrode 8 is formed in the direction crossing with the extending direction of the lower electrodes 2 so as make contact with the connection tabs 3-1.

In this case, the upper electrode 8 is formed of a conductive material such as Mg—Ag alloy, Al and the like.

A passivation layer such as an oxygen absorption layer, a moisture absorption layer, a moisture-proof layer and the like is then formed thereon. Finally, encapsulation is carried out using a sealant and a sealing plate to complete device fabrication.

Figure 4A:
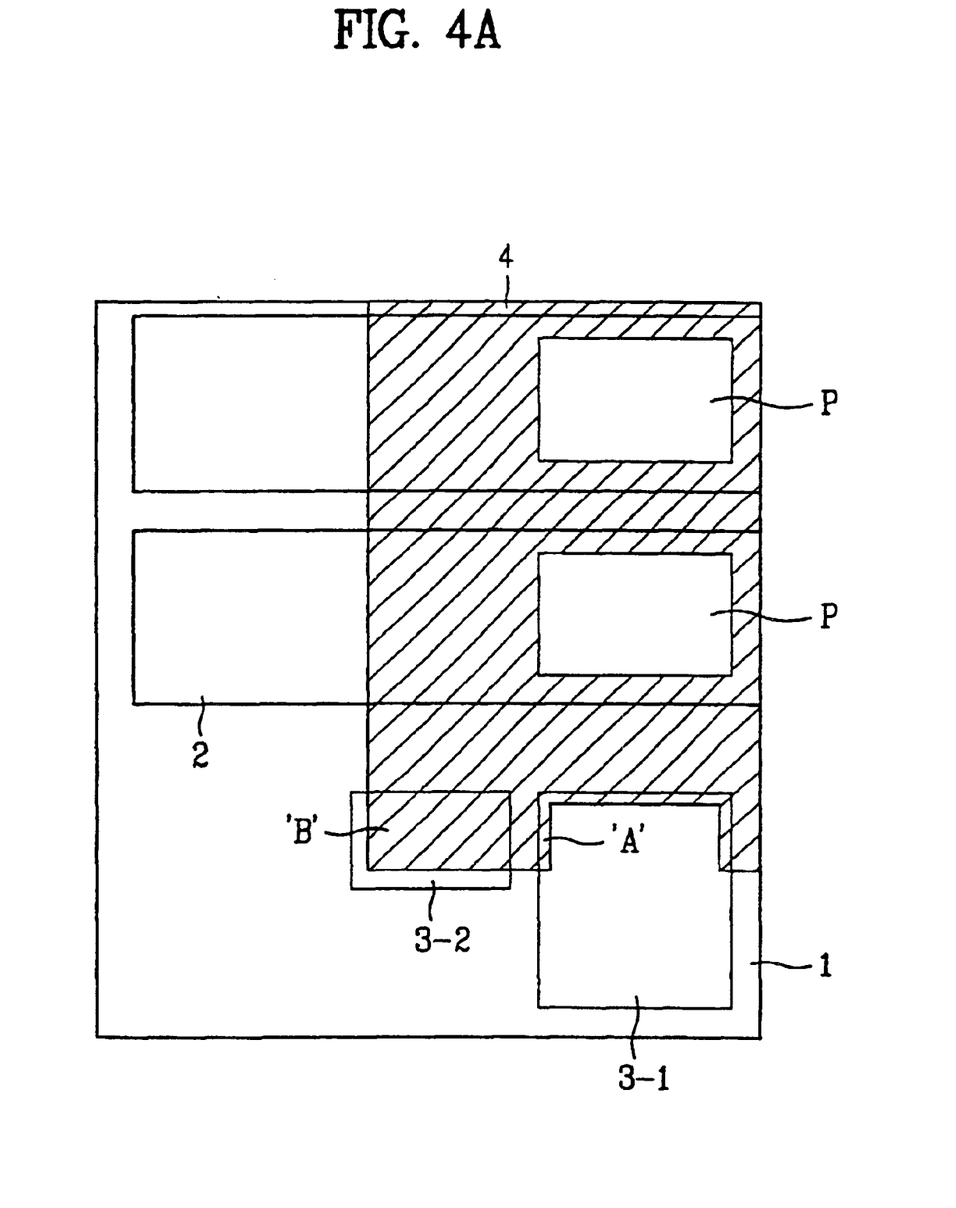
FIG. 4A illustrates a diagram for auxiliary pattern shapes of a flat panel display according to the first embodiment of the present invention.

FIG. 4A illustrates a diagram for auxiliary pattern shapes of a flat panel display according to the first embodiment of the present invention, in which a dotted square in FIG. 3B is magnified.

Referring to FIG. 4A, 'A' indicates a part at which the edges of the connection tabs 3-1 are overlapped with the insulating layer 4 to prevent peeling of the insulating layer 4. 'B' indicates a part at which the insulating layer 4 overlaps the auxiliary pattern 3-2 to prevent peeling of the insulating layer 4. Therefore, parts A and B prevent the insulating layer from peeling.

Figure 4B:
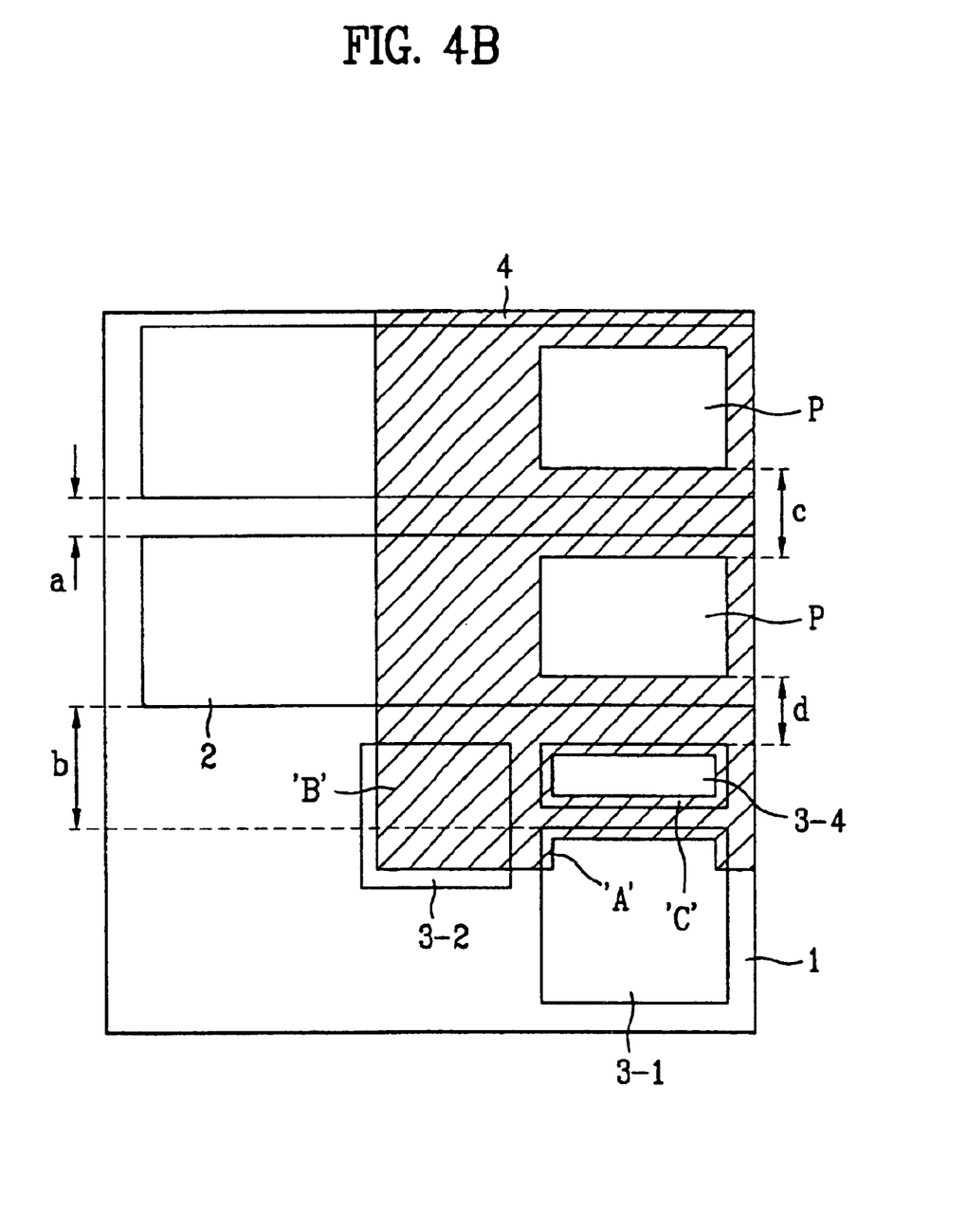
FIG. 4B illustrates a diagram for auxiliary pattern shapes of a flat panel display according to a second embodiment of the present invention.

FIG. 4B illustrates a diagram for auxiliary pattern shapes of a flat panel display according to a second embodiment of the present invention, in which at least one auxiliary pattern 3-4 is further formed between the lower electrodes 2 and connection tabs 3-1.

Referring to FIG. 4B, the insulating layer 4 has a via part so as to overlap the edges of the auxiliary pattern 3-4 as much as 'C'. The insulating layer 4 extends to portions of the connection tabs 3-1 over the substrate 1 so as to overlap the connection tab 3-1. And, the via part contacts the upper electrode 8.

The insulating layer 4 may be formed to cover the edges of the auxiliary pattern 3-4 or the edges of the connection tabs 3-1 as well as the edges of the auxiliary pattern 3-4.

In this case, the auxiliary patterns 3-4 are formed to have a distance d between the adjacent luminescent pixel P and the auxiliary pattern 3-4 exposed by the insulating layer 4, in which the distance d is similar to the distance c between the adjacent pixels P.

The auxiliary patterns 3-4 have influence on endurance and yield of a flat panel display.

In order to prevent the lower electrode 2 and connection tabs 3-1 from being shorted, the connection tabs 3-1 should be a predetermined interval b from the lower electrodes 2. In this case, the predetermined interval b is much wider than an interval a between the adjacent lower electrodes.

If the insulating layer 4 is formed to cover the edges of the connection tabs 3-1 to prevent the peeling of the insulating layer 4, the distance d between the adjacent luminescent pixel P and auxiliary pattern 3-4 exposed through the insulating layer 4 becomes longer than the distance c between the adjacent luminescent pixels P.

Hence, compared to other luminescent pixels P, the luminescent area of the luminescent pixels P next to the edges is reduced, thereby decreasing brightness of those pixels.

If the distance d gets longer, an amount of discharged gas which penetrates into the insulating layer 4 during the process of forming the insulating layer 4 increases. The amount of discharged gas which may possibly penetrate into the edges of the luminescent pixel P becomes larger than the amount possibly penetrating into the luminescent pixel excluding the edges. Thus, a leakage current flowing into the organic luminescent layer 7 occurs, thereby causing damage on the organic luminescent layer 7.

As mentioned in the above description, a flat panel display device and fabricating method thereof according to the present invention has following advantages.

In forming an insulating layer which would normally have poor adhesiveness to a substrate, auxiliary patterns are formed on portions of the substrate prior to applying the insulating layer to prevent the insulating layer from peeling. Accordingly, the present invention improves device performance and endurance by forming an insulating layer having a desirable shape.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a flat panel display device, comprising the steps of:

forming a plurality of lower electrodes on a substrate so as to extend in one direction wherein luminescent pixels are defined over the lower electrodes;

forming a plurality of connection tabs on one edge of the substrate in a direction crossing with the extending direction of the lower electrodes so as not to be overlapped with the lower electrodes and forming at least one auxiliary pattern on an edge area of the substrate;

forming an insulating layer on an area excluding the luminescent pixels and the lower electrodes so as to be overlapped in part with the at least one auxiliary pattern; and forming an upper electrode over the lower electrodes so as to be contacted with the connection tabs.

2. The method of claim 1, further comprising a step of forming an organic luminescent layer on the respective luminescent pixels.

3. The method of claim 1, further comprising a step of forming partition walls on the insulating layer between columns of the luminescent pixels in the extending direction of the lower electrodes so as to electrically isolate the upper electrode every column unit of the luminescent pixels.

4. The method of claim 1, further comprising a step of forming an auxiliary electrode on a predetermined area of the respective lower electrodes and connection tabs wherein the auxiliary electrode has a resistance lower than that of the lower electrode and that of connection tab.

* * * * *